United States Patent [19]

Bristol

[11] Patent Number: 4,581,585

[45] Date of Patent: Apr. 8, 1986

[54] APPARATUS AND METHOD FOR AUTOMATICALLY CALIBRATING A SWEEP WAVEFORM GENERATOR

[75] Inventor: L. Rodney Bristol, Tigard, Oreg.

[73] Assignee: Tektronix, Inc., Beaverton, Oreg.

[21] Appl. No.: 464,286

[22] Filed: Feb. 7, 1983

[51] Int. Cl.$^4$ .................. H03K 4/08; H03K 4/50; H03K 6/04
[52] U.S. Cl. .................... 328/185; 307/228; 307/491; 328/130.1
[58] Field of Search .................. 307/228, 491; 328/129.1, 130.1, 132, 135, 181, 183–185, 189

[56] References Cited

U.S. PATENT DOCUMENTS

| | | |
|---|---|---|
| 3,603,981 | 9/1971 | Rollenhagen et al. .............. 328/181 |
| 3,914,623 | 10/1975 | Clancy ................................. 328/181 |
| 3,971,923 | 7/1976 | Linder ................................. 328/181 |

*Primary Examiner*—John Zazworsky
*Attorney, Agent, or Firm*—Terrance A. Meador; Daniel J. Bedell

[57] ABSTRACT

An apparatus and method are provided for automatically calibrating sweep waveforms produced by a sweep generating circuit in response to digital time reference words produced by a system controller. Time interval measurements are made directly on sweep waveforms and sweep slope values are derived therefrom. The sweep slope values are used by the system controller to adjust the digital time reference words.

5 Claims, 5 Drawing Figures

APPARATUS AND METHOD FOR AUTOMATICALLY CALIBRATING A SWEEP WAVEFORM GENERATOR

BACKGROUND OF THE INVENTION

The present invention relates to calibration of sweep generation circuits, and more particularly to calibration of a sweep signal generator by use of time intervals measured on repetitive sweep signals produced by the circuit.

Instruments which measure electronic signals employ sweep circuits to establish a range of values against which a quantity to be measured can be compared. In oscilloscopes, for example, the displacement of the visible cathode-ray trace on the screen of the oscilloscope is controlled by a horizontal sweep circuit comprising a ramp or sawtooth wave generator which provides a sweep signal to the horizontal deflection circuits of the CRT. Such circuits are well known in the art of oscilloscope design and engineering.

Calibration of sweep signal generating circuits is a continual and time-consuming process. As is known, such circuits comprise analog components having characteristics which are determined to various degrees of precision and which can be altered by long-term effects such as aging. Further, those components can also exhibit short-term alterations in operating values in response to variations in the ambient environment of the circuit. These changes in component characteristics can affect the characteristics of the waveforms generated by the circuit which can result in degradation of the measurements whose range of values depends upon the sweep signals.

In order to establish and maintain the accuracy of a measuring system employing a sweep generating circuit, the circuit is periodically calibrated by altering the characteristics of the waveforms it produces to correspond with the characteristics of a standard or calibrating signal. This is accomplished by the provision of circuit components having adjustably variable characteristics, which permit alteration of the transfer function of the circuit as required to make the produced waveform comply with the calibrating signal. For example, the horizontal sweep generation circuit of an oscilloscope can include potentiometers and adjustable capacitors which can be manually manipulated to vary selected characteristics of the sweep waveform.

Calibration of instruments such as oscilloscopes which utilize sweep circuits to provide visual displays requires visual interpretation of displayed signals, manual adjustment of variable components, and manual operation of the instrument during calibration. This can entail a great many mutually dependent steps, which increase the possibility of adjustment error due to faulty perception and judgment. Since an oscilloscope is characteristically provided with the capability of generating a multiplicity of variable time-base sweep waveforms, calibration must be performed at a number of selected sweep speeds, which multiplies the required calibration time.

An example of a calibration procedure which is required to maintain a high-performance oscilloscope in operating condition is found in the 456B Oscilloscope Instruction Manual, published by Tektronix, Inc., Beaverton, Ore.

While the aforementioned problems relating to calibration of sweep generation circuits used by measuring instruments are considerable from the standpoint of operating and maintaining the instrument, they also complicate instrument design and fabrication. For example, a timebase generation circuit for a high-performance oscilloscope requires the provision of manually operated switch circuits which comprise arrays of high-precision components, such as capacitors and resistors. High quality, precision components provide better initial accuracy and exhibit less sensitivity to long- and short-term effects and thus reduce the need for calibration. However, a result of selecting high precision components is that the cost of constructing the instrument goes up.

SUMMARY OF THE PRESENT INVENTION

The present invention is directed to the automatic calibration of sweep generation circuits through the use of a calibrating apparatus, which employs a microprocessor residing in the measuring instrument, to control the calibration process. The apparatus of the invention calibrates the slope of a ramp signal produced by a sweep generator operating in response to digital time reference words produced by the instrument controller. Calibration is performed according to an iterative process in which the relationship between the slope of a sweep signal and a respective time reference word is determined by means of a linear relationship which is established between ramp slope values produced in response to arbitrarily chosen time reference words.

The apparatus of the invention includes a sweep generation circuit which produces a sweep signal in response to a digital timing reference signal. The sweep generation circuit also produces a sweep gate signal. A reference voltage selection circuit selectively provides comparison reference signals in response to the sweep gate signal. The comparison reference signals comprise DC voltage levels which are contained within the range of voltage traversed by the sweep signal. A comparator compares successive cycles of the sweep signal to the comparison reference signals for providing marker signals indicating that the sweep signal has exceeded the level of the comparison reference voltage against which it is being compared. The sweep gate signal and the marker signals are provided to a time measurement device which measures the time which elapses between the leading edge of the sweep gate signal and preselected transitions in the marker signals. The time measurement device further provides measurement data signals which are representative of the elapsed time intervals. The system controller utilizes the measurement data signals to, if necessary, adjust the values of an array of factors which are used by the controller to calculate the timing reference signal which controls the slope of the output ramp.

In the method of the invention, a sweep waveform is provided in response to a predetermined digital time reference word. Comparison reference signals are generated and compared with the sweep waveform to produce, based upon the comparison, marker signals. Thereafter, the times which elapse between the occurrence of predetermined portions of the marker signals and predetermined portions of the sweep gate waveform are measured, and, if indicated by the measurement, the predetermined digital time reference signal is changed by the controller.

By making extensive use of digital processing circuitry, the apparatus of the invention is able to generate and store calibration data, which can be evaluated during a calibration sequence, and automatically alter the sweep signal of interest, thereby eliminating the need for many of the manual adjustments presently required to calibrate existing measurement instruments. Another salient feature of the use of digital processing circuitry is that the need for close matching and tolerancing of sweep circuit components may be reduced through the automatic alteration of signals developed by those components, the alteration being performed by the digital circuitry.

Another object of the invention is to employ the digital processing circuitry to improve the time measurement accuracy resulting from calibration of sweep waveforms by the elimination of requirements for visual interpretation, manual adjustment, and manual operation of the sweep generating circuitry during calibration and by accurately compensating for circuit component tolerances.

As a result of the reduction of human operations in performing calibration of sweep generating circuits, the apparatus and method of the invention minimize the number of calibration steps required to be performed by an operator, and thus reduce the total time required for calibration.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
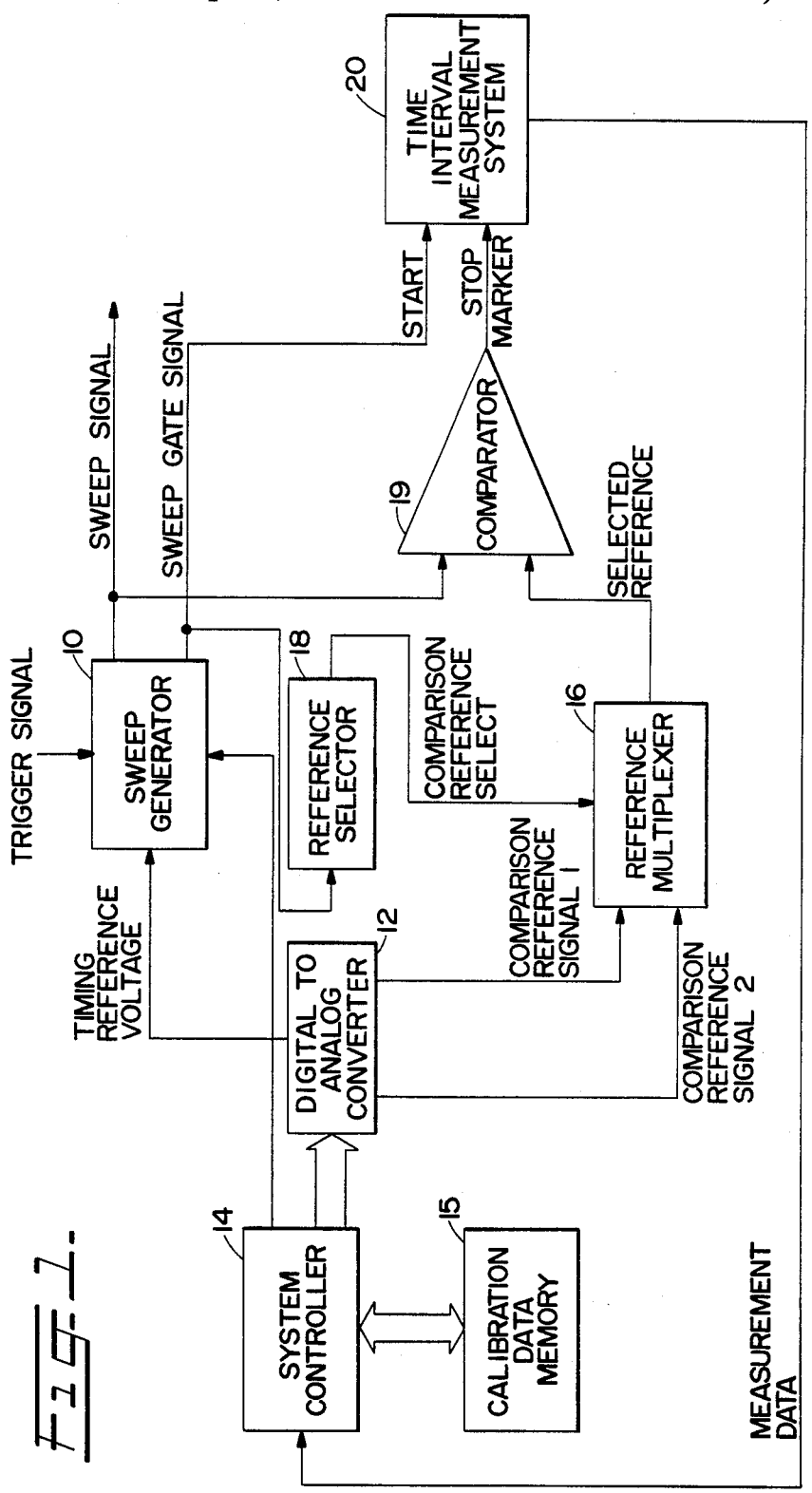
FIG. 1 is a block diagram showing the principal components of the apparatus of the invention.

A detailed exemplary application of the present invention is shown in FIG. 1 wherein a sweep generator 10 produces linear sweep waveforms having adjustably alterable slopes. The sweep signals may be amplified and employed, for example, to horizontally sweep a CRT beam across the face of an oscilloscope display. As is known, when the sweep generator 10 is employed to generate the horizontal sweep signal for an oscilloscope, it also produces a sweep gate signal for indicating the presence of the rising ramp of the sweep signal so that other instrument functions may be coordinated therewith.

The sweep signal is produced by the sweep generator 10 in response to a timing reference voltage signal, explained in greater detail hereinbelow, which is provided as an adjustably variable analog voltage by a digital-to-analog converter 12 with multiple outputs, which may comprise any of a number of well-known devices. The level of the timing reference voltage signal is determined by a digital time reference word produced by a system controller 14, which can comprise, for example, a 6802 microprocessor, augmented with auxiliary logic, not shown, and a non-volatile memory 15. The time reference word provided by the system controller 14 is constructed in response to a timebase value which may be selected, for example, by a timebase switch, not shown, which is available to an operator, and which provides an input directly to the system controller 14.

Thus, for a selected timebase value, the system controller 14 will construct a time reference word related to the selected value and the word will be provided to the digital-to-analog converter 12. A timing reference voltage signal having a level determined by the digital word will be produced by the digital-to-analog converter 12 and provided to the sweep generator 10 on the indicated signal line. The sweep generator 10, in response to a trigger signal, will produce a sweep gate signal and a sweep signal whose slope is determined by the voltage level of the timing reference voltage signal.

The system controller 14 also responds to a selected time-base value by producing control signals which cause the current amplification and capacitance characteristics of the sweep generator 10 to assume a value which, when driven by a constant current derived from the timing reference voltage signal will provide the required slope to the rising ramp of the sweep signal.

The system controller 14 also is programmed to cause digital-to-analog converter 12 to provide at least a pair of comparison reference signals having predetermined voltage levels to a reference multiplexer 16, which can comprise a 4053 CMOS circuit, or equivalent device. The reference multiplexer 16 is controlled by a comparison reference select signal output of a reference selector 18. The reference selector 18 may comprise a toggling flip-flop which provides the reference select signal as one output whose state changes on one edge of the sweep gate signal which is provided to the reference selector by the sweep generator 10. The sweep signal produced by the sweep generator 10 and the selected comparison reference produced by the reference multiplexer 16 are provided as inputs to a comparator 19. The sweep gate signal, and the output of the comparator 19 are provided as the start and stop indicators, respectively, to a time-interval measurement system 20, which may comprise a Fluke 7261A counter, or equivalent. The time-interval measurement system 20 triggers on the rising edges of the start and stop indicators to measure the time which elapses between selected portions of the sweep gate signal and selected portions of the output of comparator 19, as explained hereinbelow. The elapsed time measurements made by the time-interval measurement system 20 are provided as measurement data in the form of digital words to the system controller 14.

Figure 2:
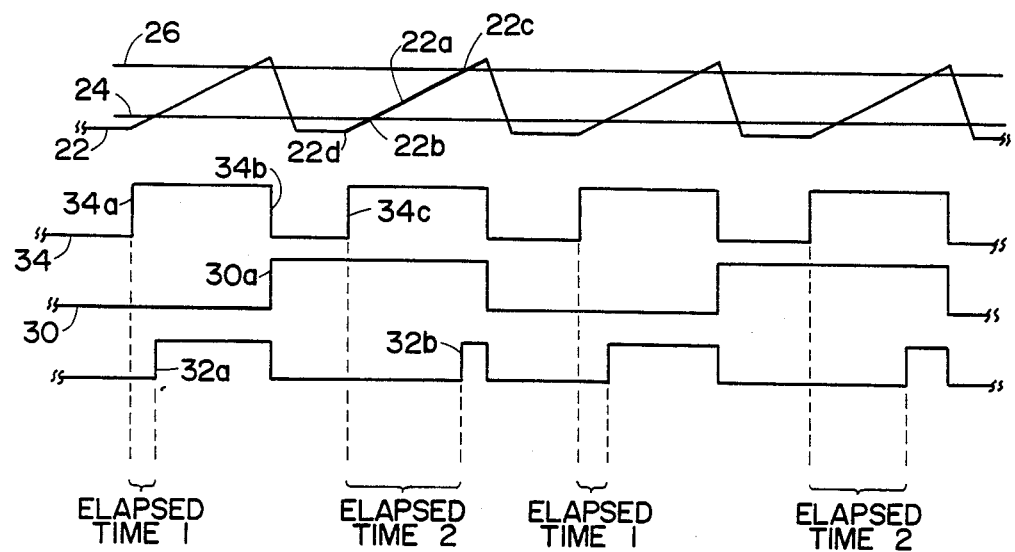
FIG. 2 is an illustration of waveforms which are produced during the operation of the apparatus illustrated in FIG. 1.

With reference now to FIG. 2, the operation of the system illustrated in FIG. 1 can be understood. The sweep signal, indicated by waveform 22, produced by the sweep generator 10 is compared first against a first comparison reference signal, indicated by voltage level waveform 24, and then against a second voltage reference signal, indicated by voltage level waveform 26. The reference selector 18 is initially in the state indicated by the reference select waveform 30 which causes the reference multiplexer 16 to output the first comparison reference signal. When the level of the sweep signal 22 exceeds the level of the first comparison reference signal 24, the output of the comparator 19, indicated by marker waveform 32, will change state as indicated by rising edge 32a. The output of the reference selector 18 changes state as indicated by the rising edge 30a in response to the first falling edge 34b of the sweep gate signal 34. This causes the second comparison reference signal to be provided to the comparator 19 which will hold its positive value until the sweep signal 22 falls beneath the second reference level 26, at which time the marker signal, indicated by waveform 32, representing the output of the comparator 19, falls back to its low state.

At the second repetition of the sweep signal 22, indicated by the rising ramp 22a, the comparator 19 will be set to compare the sweep signal against the second comparison reference signal 26. When the ramp 22a exceeds the second comparison reference signal 26, the comparator 19 will again change state as indicated by the rising edge 32b of the marker signal 32. With the time-interval measurement system 20 configured to respond to the sweep gate signal 34 and the marker signal 32 (as illustrated in FIG. 1), it is apparent that on the first repetition of the sweep signal 22 the system will be able to measure a first-elapsed time as the time from the edge 34a of the sweep gate signal 34 to the edge 32a of the marker signal 32. Similarly, a second elapsed time can be measured from the rising edge 34c of the sweep gate signal 34 to the rising edge 32b of the marker signal 32.

It is evident that the first elapsed time represents the time consumed by the sweep signal ramp in rising from its origin to the voltage level represented by the first comparison reference signal. Similarly, the second elapsed time represents the time for the ramp to ascend from its origin to the level represented by the second comparison reference signal. A value, $d_t$, may be calculated in the system controller 14 by subtracting elapsed time 1 from elapsed time 2. The value $d_t$ represents the time consumed by the sweep signal waveform ramp to rise from, for example, the point 22b where it crosses the first voltage reference signal, to point 22c where it crosses the second voltage reference signal. Since the voltage values of the first and second voltage reference signals are known, the slope, S, of the rising ramp of the sweep signal waveform 22 can be calculated by the expression:

$$\frac{\text{reference voltage 2} - \text{reference voltage 1}}{d_t} = S \quad (1)$$

In the preferred embodiment, the system controller 14 is programmed to accept the elapsed-time measurements from the time-interval measurement system 20 and perform equation 1 to derive the slope of the positive ramp of any sweep signal 22 produced by the sweep generator 10. The system controller 14 is further programmed to change the digital time reference word provided to the digital-to-analog converter 12 in order to vary the voltage level of the timing reference voltage signal provided to the sweep generator 10, and thus, the slope of any sweep signal ramp. Hence, it is evident that the FIG. 1 apparatus is able to calibrate the positive ramp of the sweep signal produced by the sweep generator 10 by comparing its instantaneous value to a nominal value and adjusting that instantaneous value to correspond to the nominal value.

Figure 3:
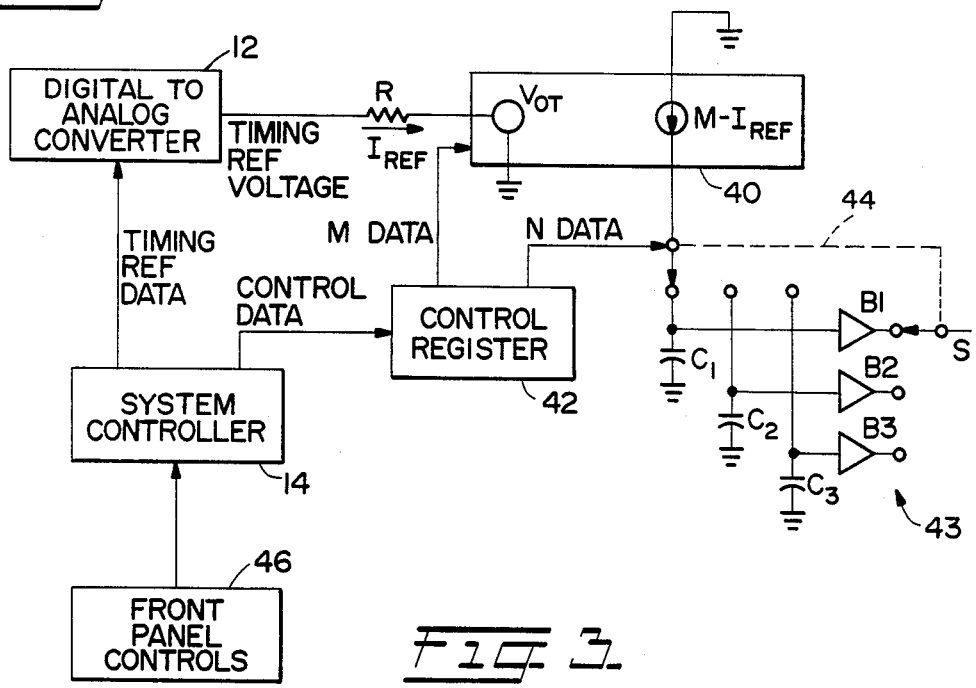
FIG. 3 is a block diagram illustrating in greater detail the sweep generator of the apparatus illustrated in FIG. 1.

FIG. 3 illustrates in greater detail the circuitry of the sweep generator circuit 10 which enables the system controller 14 to calibrate the slopes of a plurality of sweep signals produced by the sweep generator 10. In FIG. 3, a front panel control array 46 is provided which allows the user to select various functions of an instrument with which the calibration apparatus is associated. The instrument can comprise, for example, an oscilloscope with a time-base selector switch which delivers an input to the system controller 14 indicative of a desired time-base setting. The controller relates the desired setting to a specific sweep signal ramp slope in the manner described above. As is illustrated, the sweep generating circuit comprises an input-resistance R across which the timing reference voltage is applied to provide an input reference current, $I_{REF}$, which flows in the direction indicated by the arrow. $I_{REF}$ flows into a programmable constant-current source 40 which can comprise a programmable current mirror. The constant-current source 40 possesses an adjustably changeable current amplification value, M, by which $I_{REF}$ is multiplied. The product, $M \cdot I_{REF}$, is then provided to charge one of an array of selectable capacitors, C1, C2, or C3. The constant-current source 40 also has an offset voltage, represented by $V_o$, which is an artifact of the circuit and which varies with M. As is well known, the constant current provided to the selected capacitor causes the capacitor to charge linearly, with the charging voltage across the capacitor being amplified through an associated buffer B1, B2, or B3, of a buffer array 43 and provided as the sweep signal 22.

The selection of the amplification factor, M, and the charging capacitor is accomplished by control data provided from the system controller 14 through the control register 42. M is selected automatically by the constant-current source 40 according to the "M" data provided to the source. A capacitor is selected by a switch 44, which can comprise a solid state device responsive to the "N" data provided to the switch by the control register 42. In the system controller, respective time-base values selected on the instrument panel by the user are associated with respective control data words to provide specific combinations of M and capacitance to provide sweep signal ramp slopes corresponding to the selected time-base value.

The ramp slope value for a selected combination of amplification and capacitance may be varied by varying the value of $I_{REF}$. This flows from the fact that the amplified current, $M \cdot I_{REF}$, which is supplied to charge the selected capacitor, is directly dependent upon the value of $I_{REF}$ which flows into the constant-current source 40. Since the value of $I_{REF}$ depends directly upon the value of the timing reference voltage, the value of $I_{REF}$ can be adjusted by adjusting the value of the timing reference voltage as explained hereinabove. In this manner, the arrangements illustrated in FIGS. 1 and 3 provide the system controller with ability to calibrate the ramp slope of a selected sweep signal against a nominal slope value.

In the calibration routine of the system controller 14 on the preferred embodiment, the digital word which causes the digital-to-analog converter 12 to produce the timing reference voltage is related to the known physical attributes of the sweep generation circuitry FIG. 3 by the relation:

$$\text{REF DATA} = K \frac{(d_v/d_t) \cdot R \cdot C_s}{M_s} + RD_o \quad (2)$$

where REF DATA is the digital time reference word, $(d_v/d_t)$ is the slopes of the positive ramp of the sweep signal, R is the value of resistor R, $C_s$ is the value of selected capacitance, $M_s$ is the value of selected current amplification, $RD_o$ is an offset reference data value required to produce a zero slope S due to the offset voltage exhibited by the sweep circuit, and K is the scaling factor required for the digital-to-analog converter to produce the voltage required for the desired value of $I_{REF}$.

Figure 4:
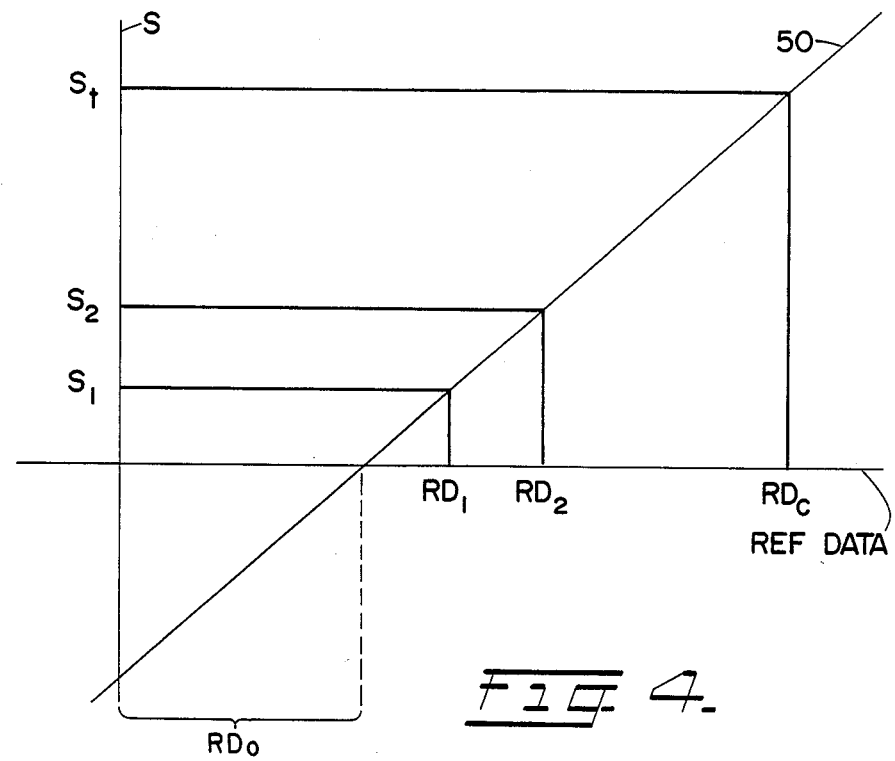
FIG. 4 is a diagram of a linear equation developed by the system controller to perform the calibration procedure of the invention.

To calibrate a value of REF DATA, the system controller 14 first selects a value of $M_s$ and a capictor $C_s$ which may be related to a setting of the front panel time-base selector. Next, the controller arbitrarily selects two values of REF DATA, provides them to the digital-to-analog converter 12, and measures the resulting slopes according to the elapsed-time method of equation (1). Using these two sets of values, the controller can calculate the equation of a line which linearly relates values of REF DATA and slope values. This relation is illustrated in FIG. 4 by line 50, where $RD_1$ represents one selected value of REF DATA and $S_1$ represents the value of the ramp slope of the resulting sweep signal. $RD_2$ and $S_2$ are similarly related. The intercept of the line 50 represents the value of $RD_o$ associated with the value of M which has been selected.

The linear relation of FIG. 4 is then used by the controller to select the value of REF DATA, $RD_c$, which corresponds to a target slope, $S_t$, related to the setting of the time-base controller. The selector then generates a second linear equation using $RD_c$ and $AxRD_c$ as $RD_1$ and $RD_2$ respectively and again finds a new value of RD corresponding to the target slope $S_t$. In the preferred embodiment, A=3 to provide for calibration of all values of RD contained in the range of a variable time-base control which can continuously expand the setting of the time-base selector by up to 3X the scale reading.

The procedure of calculating successive linear relations is performed iteratively by the system controller until the difference between successive values of $RD_c$ corresponding to the target slope $S_t$ falls within a range of acceptable calibration. At this point, the linear relationship represents an acceptable calibration of REF DATA values for the range of sweep signal slopes associated with the time-base range possible at the selected setting of the time-base selector. The relation can be stored in the calibration data memory 15 to produce values of REF DATA for time-base settings associated with the relation. This procedure can be implemented in a calibration routine which can sweep automatically to calibrate all of the possible settings of the time-base range selector.

However, in order to reduce the time required to completely calibrate the sweep generator and to reduce the total memory space allocated to the storage of calibration data, the calibration procedure of the invention follows a routine which limits the amount of calibration data required to be stored. The selection of sweep ramp slopes add $S_t$ associates various combinations of $C_s$, $M_s$, and $RD_o$. However, since an $S_t$ calibration value for each $C_s$ is detemined with a specific $M_s$ and $RD_o$ and values for each $M_s$ and $RD_o$ are determined with a specific $C_s$, the number of calibration steps is minimized.

Figure 5:
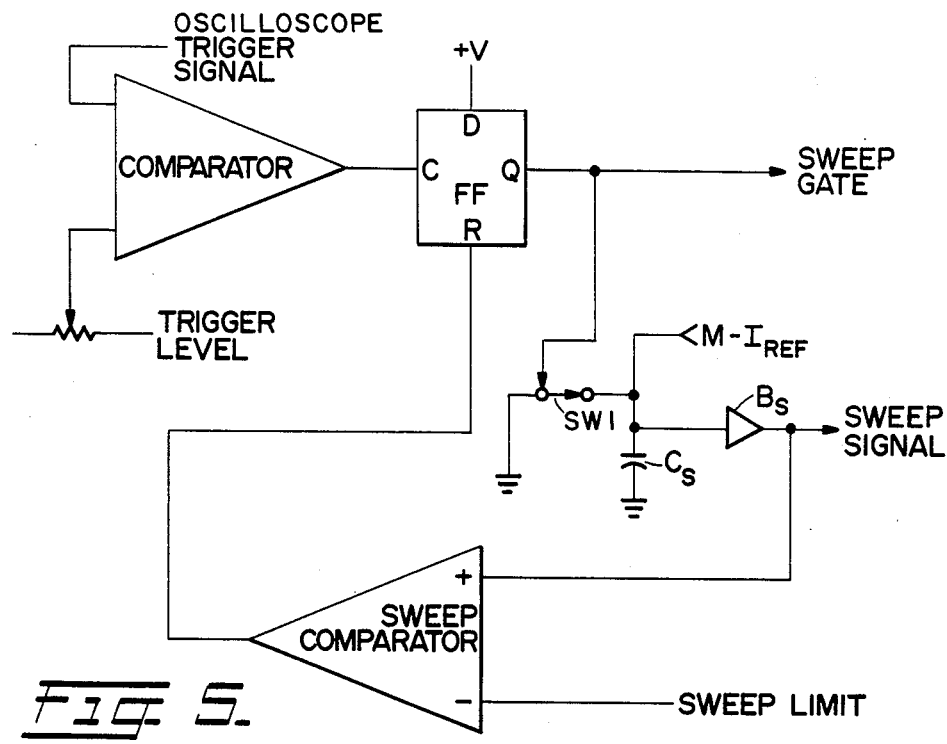
FIG. 5 is a circuit diagram illustrating a circuit for synchronizing the sweep signal and sweep gate signals produced by the sweep gate generator.

Although generation of a sweep gate signal in conjunction with a sweep signal is known in the art of oscilloscope design, FIG. 5 illustrates a means of synchronizing the two signals. In the circuit illustrated, an oscilloscope trigger signal causes a flip-flop (FF) to raise its output which causes the sweep gate signal to rise. In rising, the sweep gate signal opens a switch SW1 which may be a solid state FET gate. When SW1 is opened, $M \cdot I_{REF}$ charges the selected capacitor which produces the sweep signal. When the sweep crosses an upper sweep limit, the sweep comparator which is switchably coupled to the selected buffer $B_s$ changes state, which resets the flip-flop (FF), closing switch SW1 which diverts $M \cdot I_{REF}$ and discharges the selected capacitor $C_s$. The sweep gate signal and the positive ramp of the sweep signal thereby both change simultaneously.

It is evident that the apparatus illustrated in FIG. 1 can be placed in a single instrument such as an oscilloscope with the provision of a time-interval measurement circuit or controller time measurement routine. Further, it is evident that the voltage reference signals can be provided directly to the comparator 19 from the digital-to-analog converter 12 with the phasing of their production accomplished by a routine in the system controller 14. Finally, it is apparent that the calibration data must be stored in a non-volatile section of the controller memory so that the data is retained when the instrument is turned on.

It is evident also that the ramp slope measurement can be made using only one comparison reference. For example, elapsed time 2 in FIG. 2 can be converted directly into a slope measurement if the voltage origin of the ramp, point 22d on waveform 22, is known. Then, the slope will equal the difference in the voltage values at points 22d and 22c divided by elapsed time 2.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. An apparatus for producing calibrated sweep waveforms, comprising:
   (a) sweep generator means, responsive to a timing reference signal, for producing a sweep signal having a slope controlled by said timing reference signal;
   (b) means for providing a plurality of comparison reference signals;
   (c) means responsive to said comparison reference signals and to said sweep signal for measuring the time from when said sweep signal has a predetermined relationship with one of said comparison reference signals until said sweep signal has a predetermined relationship with another one of said comparison reference signals and providing a time interval signal representative of said time; and
   (d) controller means, responsive to said time interval signal, for producing said timing reference signal, and for adjusting said timing reference signal based upon a plurality of said time measurements, each performed as said timing reference signal is adjusted to produce a different sweep signal slope.

2. A method for calibrating sweep waveforms, comprising the steps of:
   (a) providing a sweep signal in response to a timing reference signal, said sweep signal having a slope controlled by said timing reference signal;

(b) providing a plurality of comparison reference signals;

(c) measuring the time from when said sweep signal has a predetermined relationship with one of said comparison reference signals until said sweep signal has a predetermined relationship with another one of said comparison reference signals; and (d) adjusting said timing reference signal based upon a plurality of said time measurements, each performed as said timing reference signal is adjusted to produce a different sweep signal slope.

3. A method for calibrating a sweep signal generator of the type producing a sweep signal having a slope proportional to an applied digital reference number, said sweep signal generator being calibrated to produce a sweep signal of a selected target slope, the method comprising:

a. applying a first digital reference number to said signal generator to produce a first sweep signal;

b. measuring a first time required for said first sweep signal to change from a first to a second reference voltage level;

c. computing a first sweep signal slope from said measured first time and a difference between said first and second reference voltage levels;

d. applying a second digital timing reference number to produce a second sweep signal, said second digital reference number having a magnitude differing from that of said first digital reference number;

e. measuring a second time required for said second sweep signal to change from a third to a fourth reference voltage level;

f. computing a second sweep signal slope from said measured second time and said difference between said third and said fourth reference voltage levels;

g. establishing from said first and second reference numbers and from said computed first and second sweep signal slopes a linear equation relating reference numbers to sweep signal slopes; and h. computing from said linear equation a nominal reference number required to produce said target sweep signal slope when applied to said signal generator.

4. A method as in claim 3 further comprising the steps of:

i. repeating steps a through h using a selected multiple of said nominal reference number as said first reference number and another selected multiple of said nominal reference number as said second reference number; and j. repeating step i until a most recently computed nominal reference number differs from a next most recently computed nominal reference number by less than a selected amount.

5. An apparatus for calibrating a sweep signal generator of the type producing a sweep signal having slope proportional to an applied digital reference number, said sweep signal generator being calibrated to produce a sweep signal of a selected target slope, the apparatus comprising:

means for applying a first and then a second digital reference number to said signal generator to produce a first and then a second sweep signal;

means for measuring a first time required for said first sweep signal to change from a first to a second reference voltage level, and for measuring a second time required for said second sweep signal to change from a third to a fourth reference voltage level; and means for computing a first sweep signal slope from said measured first time and a difference between said first and second reference voltage levels, for computing a second sweep signal slope from said measured second time and a difference between said third and fourth reference voltage levels, for establishing a linear equation from said first and second reference numbers and said first and second sweep signal slopes relating reference numbers to sweep signal slopes, for computing from said linear equation a nominal reference number required to produce said target sweep signal slope when said nominal reference number is applied to said sweep generator, and for iteratively changing said first and second reference numbers to multiples of said computed nominal reference number and recomputing said nominal reference number until a most recently computed nominal reference number differs from a next most recently computed nominal reference number by less than a selected amount.

* * * * *